(12) United States Patent
Kodama

(10) Patent No.: US 9,578,770 B2
(45) Date of Patent: Feb. 21, 2017

(54) PACKAGE FOR ELECTRONIC DEVICE

(71) Applicant: Sumitomo Electric Device Innovations, Inc., Yokohama-shi (JP)

(72) Inventor: Akitada Kodama, Yokohama (JP)

(73) Assignee: Sumitomo Electric Device Innovations, Inc., Yokohama-shi (JP)

(*) Notice: Subject to any disclaimer, the term of this patent is extended or adjusted under 35 U.S.C. 154(b) by 133 days.

(21) Appl. No.: 14/670,973

(22) Filed: Mar. 27, 2015

(65) Prior Publication Data
US 2015/0282366 A1 Oct. 1, 2015

(30) Foreign Application Priority Data
Mar. 28, 2014 (JP) .................. 2014-069749

(51) Int. Cl.
H05K 7/02 (2006.01)
H05K 5/06 (2006.01)
H05K 5/00 (2006.01)
H01L 23/10 (2006.01)
H01L 23/047 (2006.01)

(52) U.S. Cl.
CPC ............ H05K 5/069 (2013.01); H01L 23/10 (2013.01); H05K 5/0095 (2013.01); H01L 23/047 (2013.01); H01L 2924/0002 (2013.01)

(58) Field of Classification Search
CPC .. G02B 6/4201; H05K 5/0091; H05K 5/0095; H05K 7/142
See application file for complete search history.

(56) References Cited

U.S. PATENT DOCUMENTS

| | | | | |
|---|---|---|---|---|
| 5,574,314 A * | 11/1996 | Okada | ..... | H01L 23/10 257/659 |
| 6,140,698 A * | 10/2000 | Damphousse | ..... | H01L 23/66 257/704 |
| 6,992,250 B2 * | 1/2006 | Kubota | ..... | H01L 23/047 174/549 |
| 8,653,649 B2 * | 2/2014 | Tsujino | ..... | H01L 23/057 257/664 |
| 8,754,519 B2 * | 6/2014 | Hasegawa | ..... | H01L 23/047 257/678 |
| 2016/0105980 A1 * | 4/2016 | Mori | ..... | H01L 23/10 361/728 |

FOREIGN PATENT DOCUMENTS

JP 2013-131706 A 7/2013

* cited by examiner

Primary Examiner — Robert J Hoffberg
Assistant Examiner — Hung Dang
(74) Attorney, Agent, or Firm — Venable LLP; Michael A. Sartori

(57) ABSTRACT

A package for an electronic device is disclosed. The package includes a metal base, an insulating casing mounted on the metal base and having a seating metal on the top thereof, and a lid tightly enclosing a space surrounded by the base and the casing. The lid provides a sealing metal facing the sealing metal on the top of the casing with putting a brazing metal therebetween. The sealing metal of the lid has an area wider than an area of the sealing metal of the casing.

9 Claims, 13 Drawing Sheets

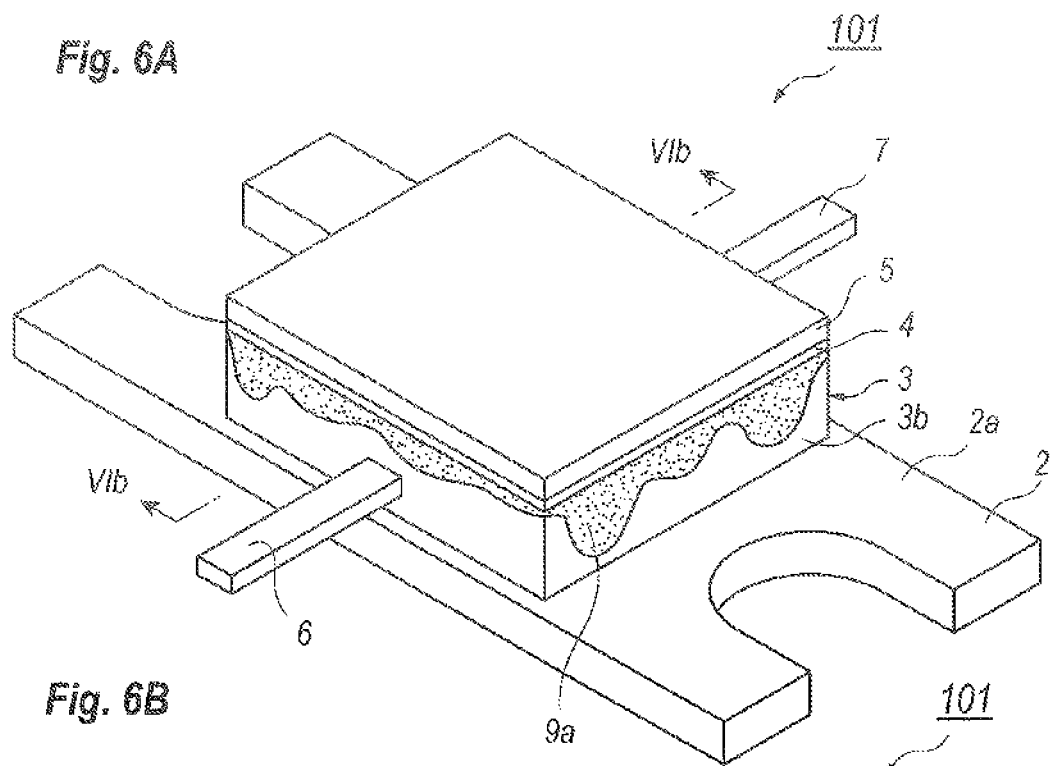
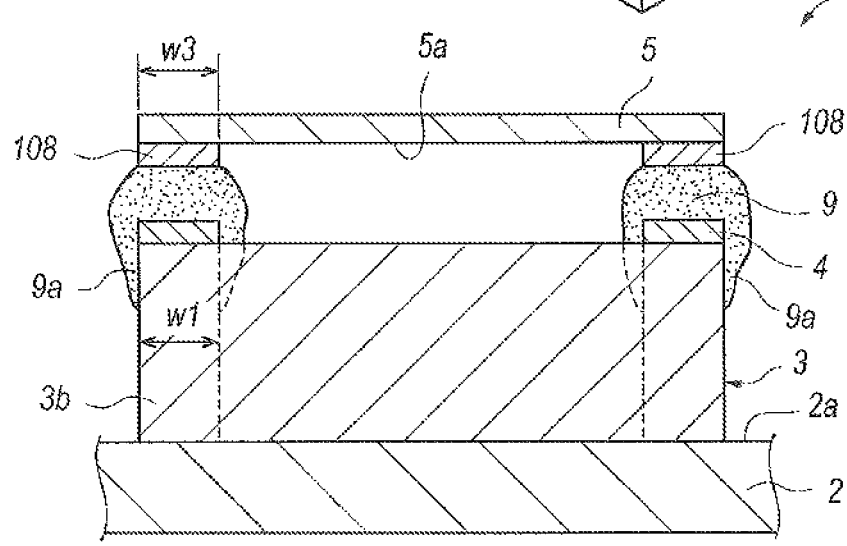

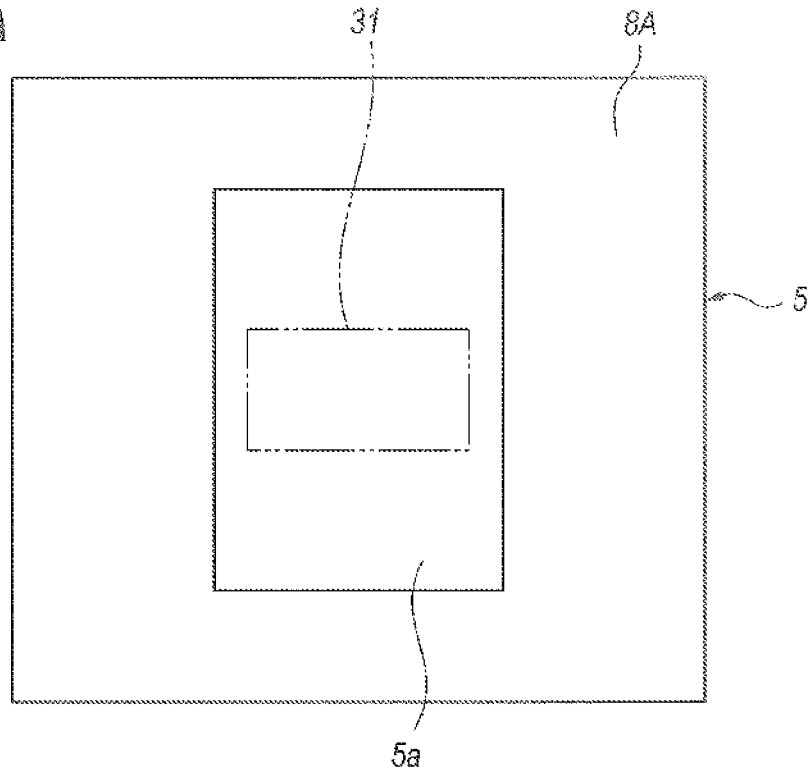
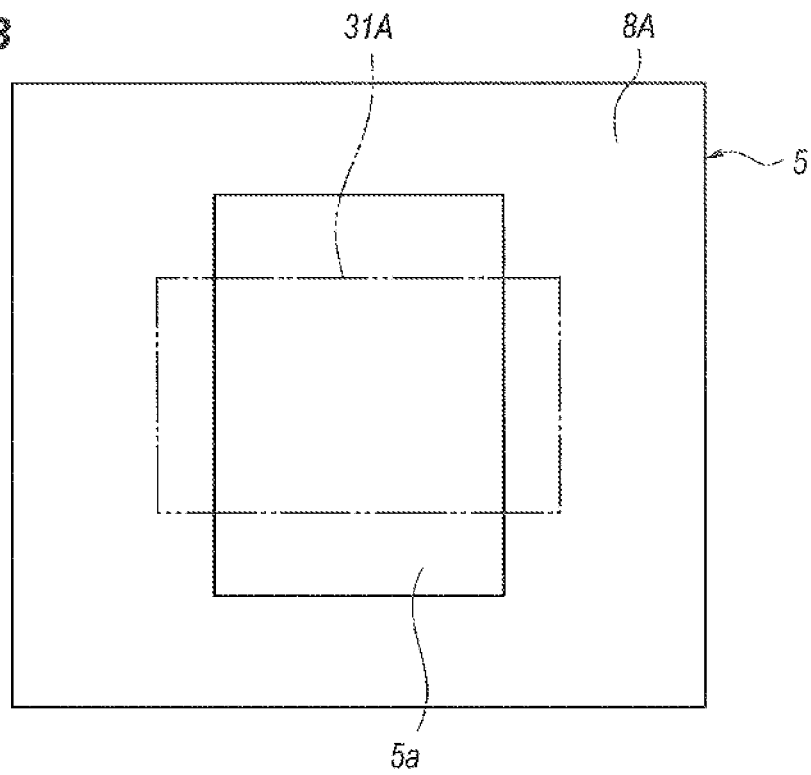

PACKAGE FOR ELECTRONIC DEVICE

BACKGROUND

1. Field of the Invention

The present invention relates to a package that encloses electronic devices and components.

2. Background Arts

A package has been used to enclose electronic devices and/or components tightly therein. One type of the package includes a casing forming a space into which the electronic devices and/or the components are installed and a lid covering the space. The lid is fixed on the casing by, for instance, the seam-sealing that melts a brazing metal. Excess amounts of the brazing metal spread on the side wall of the casing, which sometimes causes short-circuits within the casing.

One prior document has disclosed, to prevent the excess brazing metal from spreading, that the casing in at least one of inner surfaces and outer surfaces in addition to the top surface thereof provides a metal layer on which the excess brazing metal spreads.

SUMMARY OF THE INVENTION

One aspect of the present application relates to a package for an electronic device. The package provides a metal base, the casing, and the lid, where they form a space within which the electronic device is installed. The casing, which provided on the metal base, is made of insulating material and has a top surface with a sealing metal thereon. The lid, which is also made of insulating material, has another sealing metal facing the sealing metal provided on the top surface of the casing and fixed thereto as interposing the brazing metal therebetween. A feature of the package of the present application is that another sealing metal on the lid has a frame shape with an area wider than an area of the sealing metal on the casing.

The package provides a lead electrically connected to the electronic device and passing through the casing. In the present package, another sealing metal provided in the inner surface of the lid has a portion overlapped with the lead and this portion of another sealing metal has a width narrower than a width of the sealing metal facing the portion of another sealing metal and fixed thereto, or narrower than a width of the side wall through which the lead passes.

BRIEF DESCRIPTION OF THE DRAWINGS

The foregoing and other purposes, aspects and advantages will be better understood from the following detailed description of a preferred embodiment of the invention with reference to the drawings, in which:

FIG. 6A is a perspective view of a package comparable to that of the embodiment of the present application, and FIG. 6B shows a cross section taken along the line VIb-VIb denoted in FIG. 6;

FIGS. 10A and 10B show the inner surface of the lid according to the second embodiment;

DESCRIPTION OF EMBODIMENTS

Next, some preferred embodiments according to the present invention will be described as referring to drawings. In the description of the drawings, numerals or symbols same with or similar to each other will refer to elements same with or similar to each other without duplicating explanations.

First Embodiment

Figure 1:
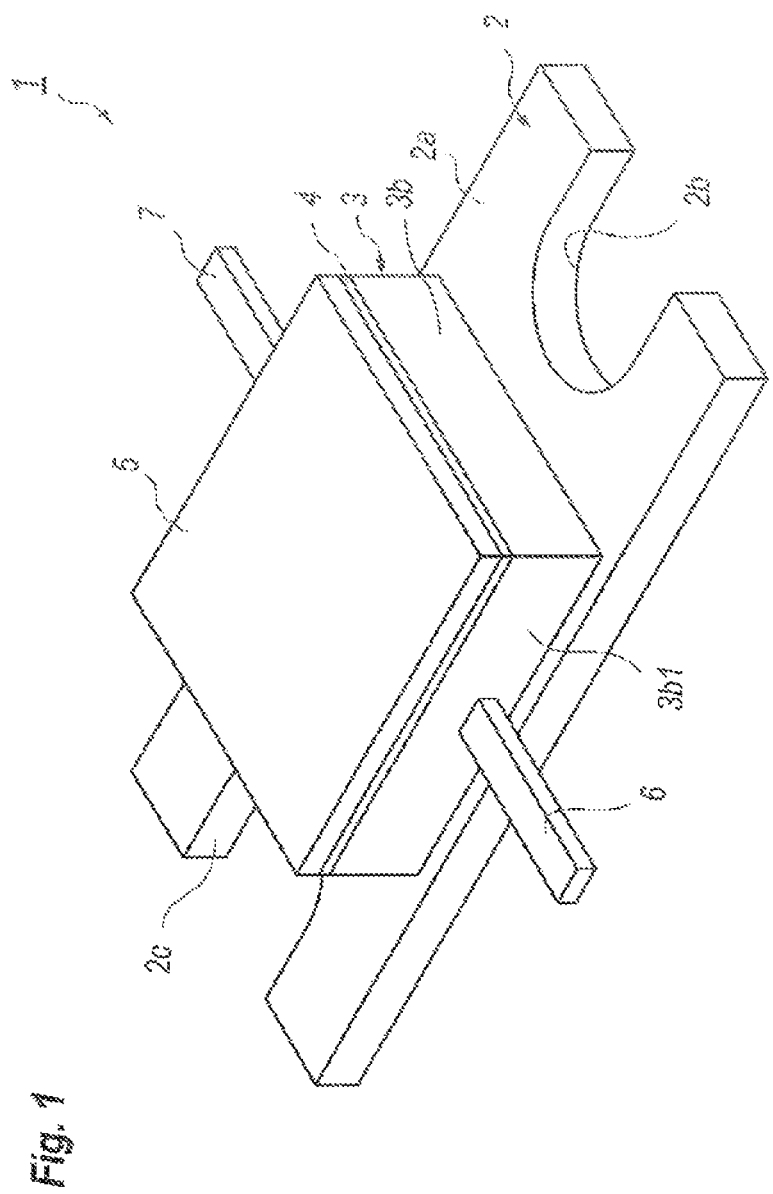
FIG. 1 is a perspective view showing a package according to the first embodiment of the present invention.
Figure 2:
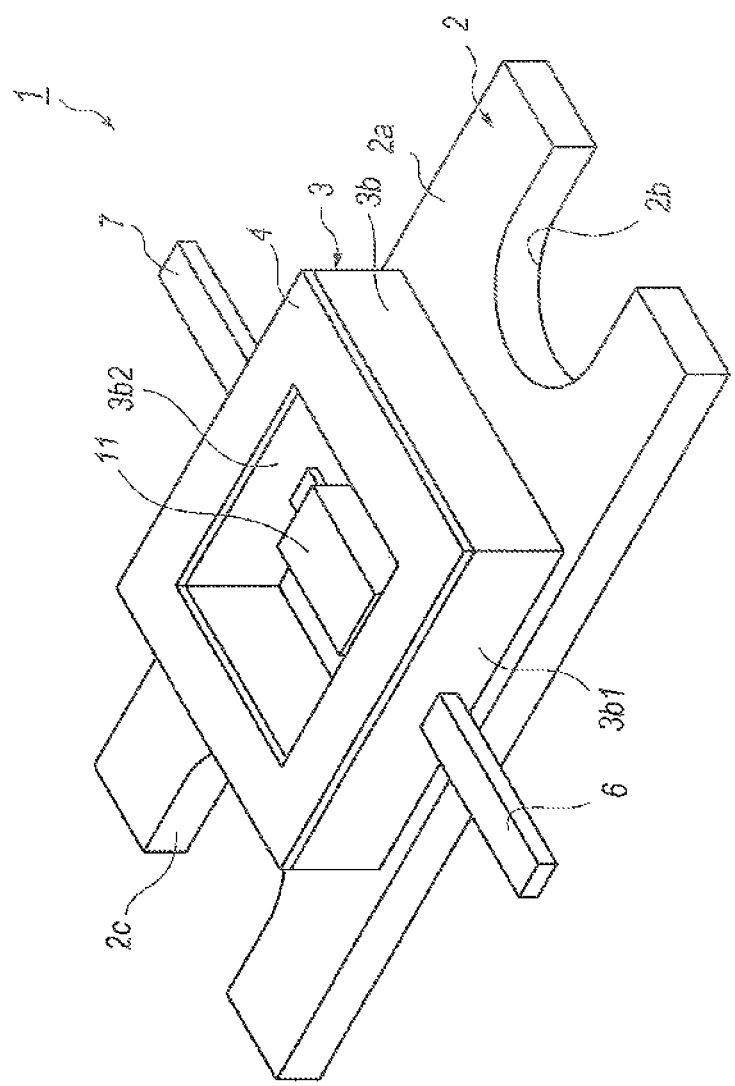
FIG. 2 is a perspective view of the package shown in FIG. 1, which removes the lid thereof to show the inside of the package.
Figure 3A:
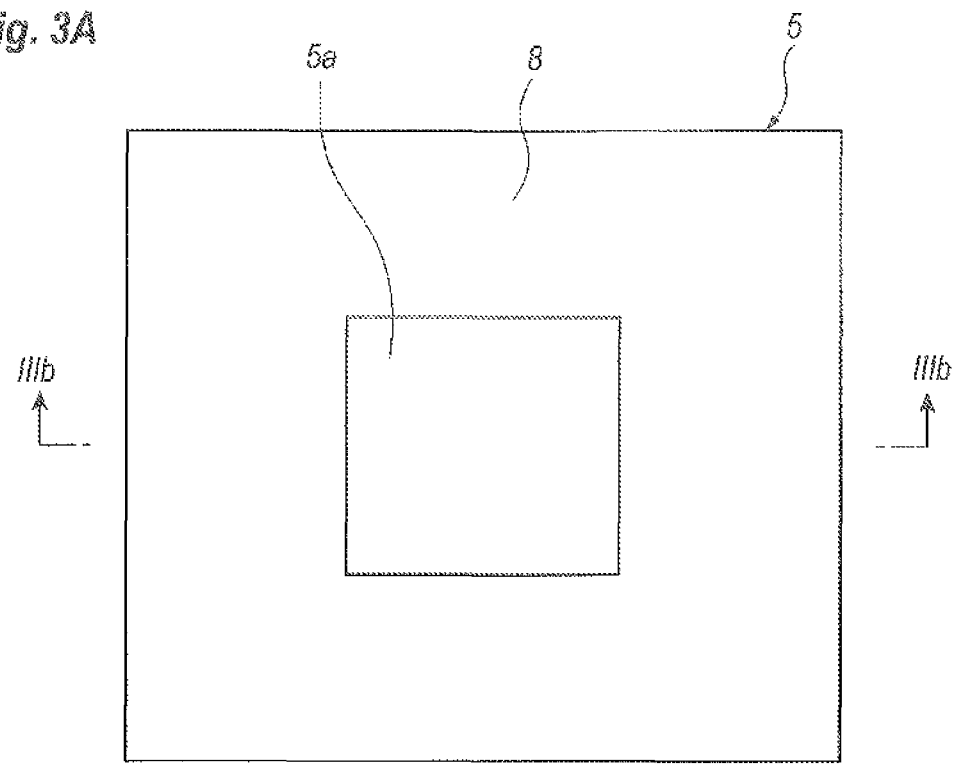
FIG. 3A is a plan view showing the inner surface of the lid of the package.
Figure 3B:
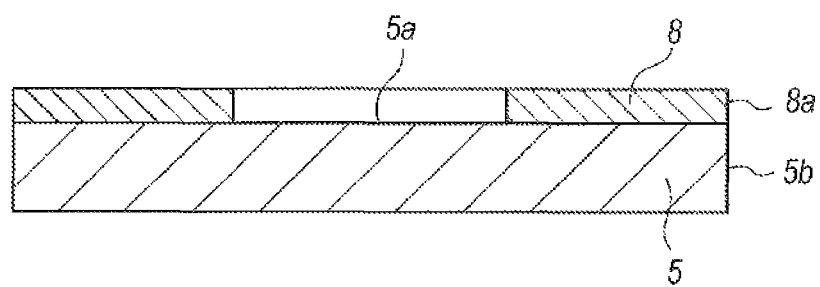
FIG. 3B is a cross section of the lid taken along the line appearing in FIG. 3A.
Figure 4:
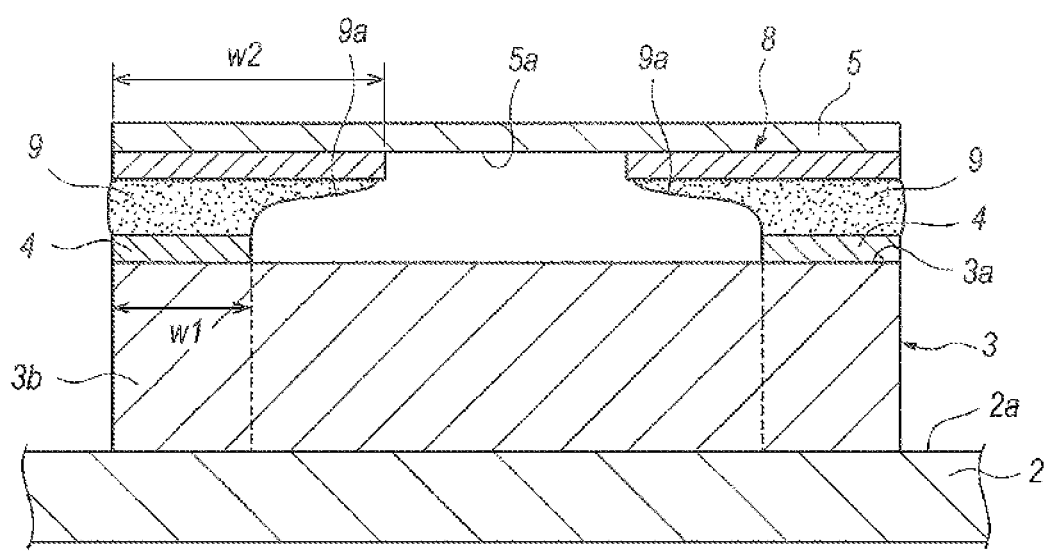
FIG. 4 shows a cross section of the package shown in FIG. 1.
Figure 5:
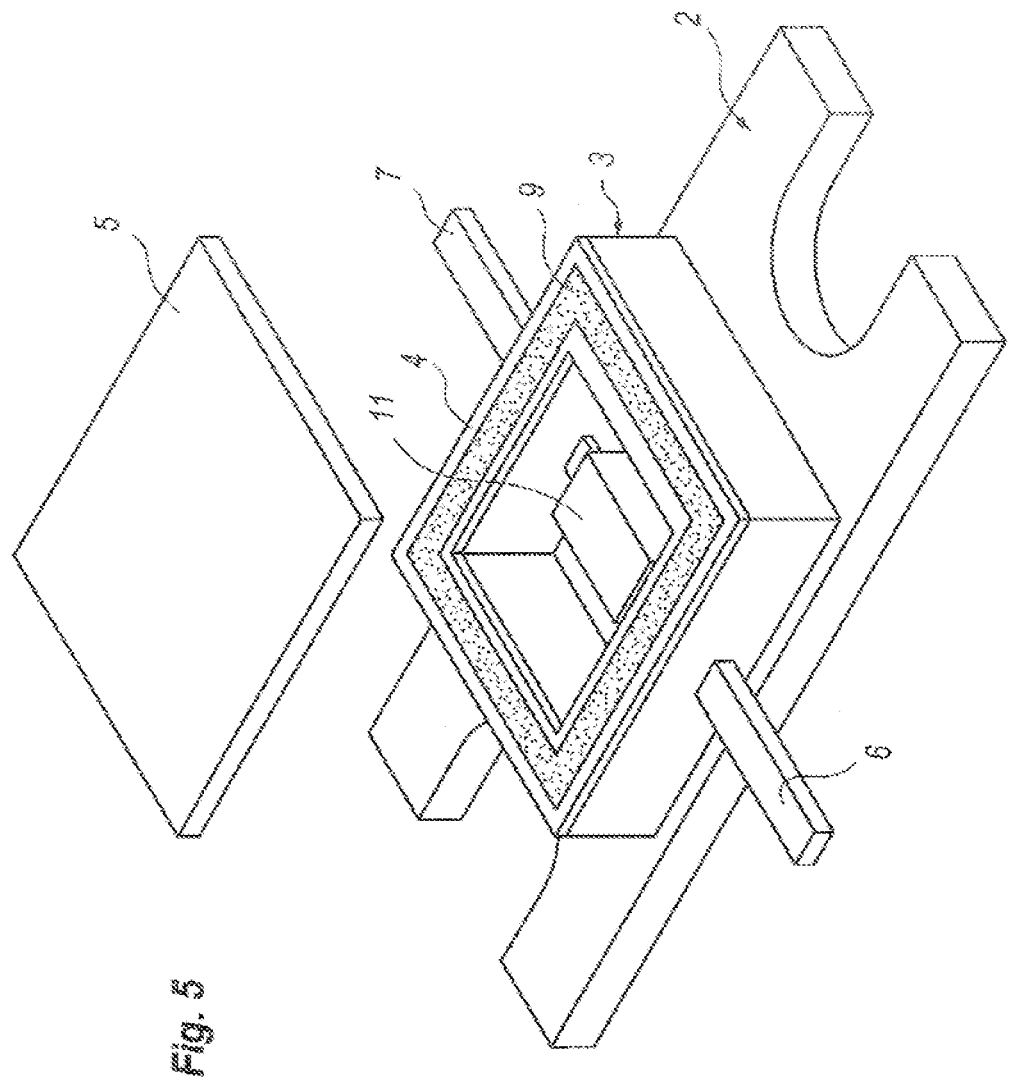
FIG. 5 is an exploded view of the package.

FIG. 1 is a perspective view showing a package according to the first embodiment of the present invention; FIG. 2 is a perspective view of the package shown in FIG. 1, which removes the lid thereof to show the inside of the package; FIG. 3A is a plan view showing the inner surface of the lid of the package, and FIG. 3B is a cross section of the lid taken along the line IIIb-IIIb appearing in FIG. 3A; FIG. 4 shows a cross section of the package shown in FIG. 1; and FIG. 5 is an exploded view of the package.

As shown in FIGS. 1 to 5, the package 1 of the present embodiment provides a base 2, a casing 3, a sealing metal 4, a lid 5, and two leads, 6 and 7. The package 1 installs an electronic device 11 in a space formed by the base 2, the casing 3, the sealing metal 4 and the lid 5. The electronic device 11 may be a semiconductor chip, a capacitor, and so on. The semiconductor chip may be a transistor of the type of the high electron mobility transistor (HEMT) primarily made of gallium nitride (GaN) able to generate the output power of 100 to 200 W.

The base 2, which has a rectangular shape, is made of metal and electrically grounded. The base 2 may be made of copper (Cu), nickel (Ni), titanium (Ti) and so on coated with gold (Au), or an alloy containing those metals. The base 2 may provide cuts, 2b and 2c, in respective lateral sides, where the lateral direction of the package 1 is assumed in the description below to be a direction perpendicular to the direction along which the leads, 6 and 7, extend, the longitudinal direction is the direction the leads, 6 and 7, extend, and the thickness direction is perpendicular to those two directions.

The casing 3, which is mounted on the top surface 2a of the base 2, comprises side walls 3b surrounding the electronic device 11. The casing 3 may be a ceramics, typically made of alumina ($Al_2O_3$). The casing 3 has dimensions of about 5 mm squares, 0.9 to 1.0 mm in height, and 0.4 to 0.6 mm in width w1 of the side walls 3b, in particular, the present embodiment of the casing 3 has the width of 0.5 mm.

The sealing metal 4, which is provided on a top surface 3a of the casing 3, has a width substantially same with that w1 of the side walls 3b, that is, the sealing metal 4 fully covers the top surface 3a of the casing 3 in the present embodiment. However, the sealing metal 4 may be narrower than the width w1 of the side walls 3b. The sealing metal may be made of gold (Au) formed by plating.

As shown in FIG. 1, the lid 5, which has a rectangular shape and put on the top surface 3a of the casing 3, seals the space surrounded by the side walls 3b. The lid 5 may be also made of ceramics with an area substantially equal to an area of the space surrounded by the side walls 3a added with an area of the top surface 3a of the casing 3. That is, the lid 5 has the dimensions substantially equal to the outer edges of the side walls 3b in the present embodiment. However, the lid 5 may have the dimension narrower than the outer edges of the side walls 3b. As shown in FIGS. 3A and 3B, the lid 5 provides in an inner surface 5a thereof, a metal pattern 8 with a frame shape having a vacant area not covered therewith and exposing the inner surface 5a of the lid 5 in a center portion thereof. The sealing metal 8 provides outer edges aligned with the edges of the lid 5. The sealing metal 8 may be made of plated gold (Au).

As shown in FIG. 4, the inner surface 5a of the lid 5 faces the top surface 2a of the base 2. The sealing metal 8 has a width w2 of 0.6 to 0.8 mm, which is wider than the width w1 of the side walls 3b by 120 to 160%. The present embodiment provides the sealing metal 8 with the width of 0.8 mm. From another view point, the sealing metal 8 has an area greater than the area of the top surface 3a of the casing 3, or the area of the sealing metal 4 by 150 to 210%. Two sealing metals, 4 and 8, are connected as putting a brazing meta 9 therebetween to seal the space surrounded by the casing 3 by the lid 5 air-tightly. A surplus brazing metal 9 spreads on the sealing metal 8 and is solidified thereon. The brazing metal 9 is first put on the sealing metal 4 on the top surface 3a of the casing 3 as shown in FIG. 5, then soldered between two sealing metals, 4 and 8. Thus, the sealing metals, 4 and 8, and the brazing metal 9 are electrically connected.

Referring to FIG. 2 again, leads, 6 and 7, pass through respective side walls, 3b1 and 3b2, of the casing 3. The leads, 6 and 7, are electrically and directly connected to the electronic device 11, or the leads, 6 and 7, may be connected to the electronic device 11 through inner connections and so on. The leads, 6 and 7, may be made of copper (Cu), nickel (Ni), and so on coated with gold (Au), or made of alloy primarily containing copper (Cu) and/or nickel (Ni). The present embodiment provides the lead 6 as the signal input terminal, while, provides the other lead 7 as the signal output terminal.

Advantages of the package 1 of the present embodiment will be described. FIG. 6A is a perspective view of a package comparable to that of the embodiment of the present application, and FIG. 6B shows a cross section taken along the line VIb-VIb denoted in FIG. 6A. As shown in FIGS. 6A and 6B, the package 101 comparable to the present embodiment provides a lid 5 with a sealing metal 108 whose width w3 is substantially comparable to the width w1 of the casing 3, which means that the area of the sealing metal 108 is substantially equal to the area of the sealing metal 4. In such a case, a surplus brazing metal 9a exuding between the casing 3 and the lid 5 is trained down the side walls 3b, which results in a failure by the visual inspection of the package 101. Also, surplus brazing metal 9a causes the short-circuit failure between the leads, 6 and 7, and the base 2. The brazing metal 9a containing materials not transmitting X-rays interferes with the internal inspection using X-rays.

The package 1 of the present embodiment, comparing with the example described above, provides the sealing metal 8 wider than the area of the sealing metal 4. The surplus brazing metal 9a oozing out between the casing 3 and the lid 5 is spread on the sealing metal 8 not overlapping with the casing 3. A difference of the wettability for the brazing metal 9a of the ceramics forming the casing 3 and that of the sealing metal 8 results in the spread of the brazing metal 9a on the sealing metal 8. The wettability of the brazing metal 9a for the sealing metal 8 is greater than that for the ceramics. Accordingly, the surplus brazing metal 9a is prevented from spreading on the side wall 3b.

Also, because the sealing metal 8 has a shape along the edges of the lid 5 to leave an area not covering thereby in a center of the lid 5, the sealing metal 8 does not interfere with the operation of the electronic device 11 especially in high frequencies. Moreover, the sealing metal 8 has the width w2 wider than that w1 of the sealing metal 4, which may spread the surplus brazing metal 9a further uniformly.

Second Embodiment

Figure 7:
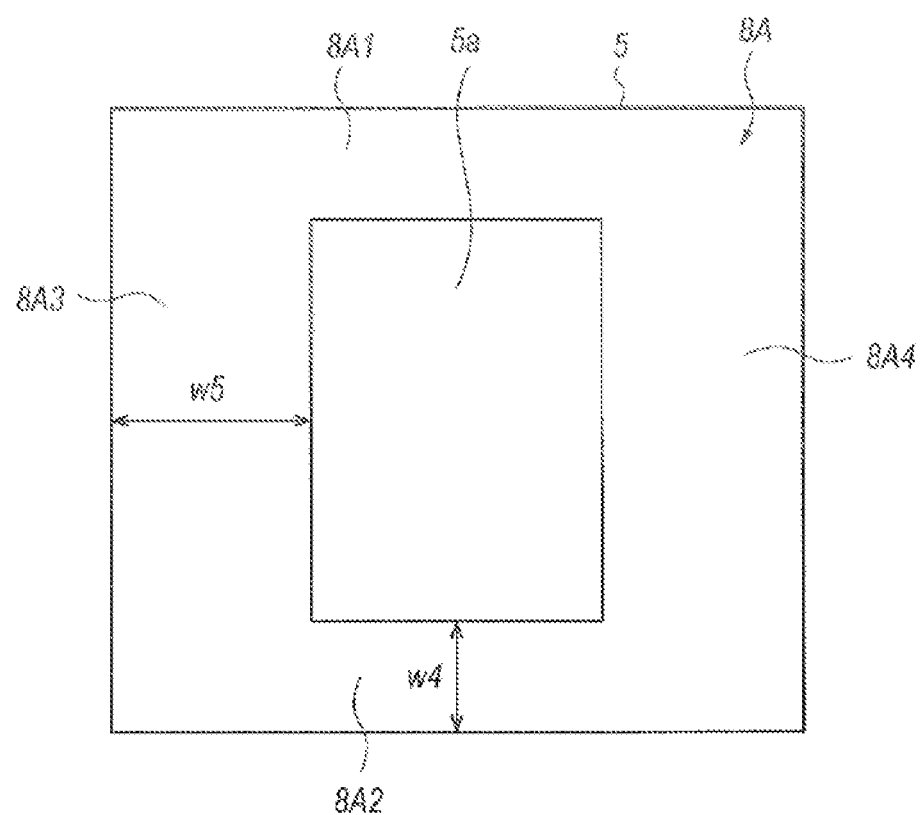
FIG. 7 shows an inner surface of the lid according to the second embodiment.

FIG. 7 shows an inner surface of the lid according to the second embodiment. As shown in FIG. 7, the inner surface 5a of the lid 5 provides the sealing metal 8A with a square frame shape. The sealing metal 8A provides regions, 8A1 and 8A2, in respective sides opposite to each other having a width w4 of, for instance, 0.5 mm, which is substantially equal to or less than the width w1 of the casing 3. The sealing metal 8A further provides other two regions, 8A3 and 8A4, along respective sides perpendicular to the sides along which the former two regions, 8A1 and 8A2, extend. Two regions, 8A3 and 8A4, provides a common width w5 of, for instance, 0.8 mm wider than the width w4 of the former two regions, 8A1 and 8A2, by 260 to 270%. In other words, the sealing metal 8A provides the area wider than the area of the aforementioned sealing metal 8 by 130 to 135%.

Figure 8:
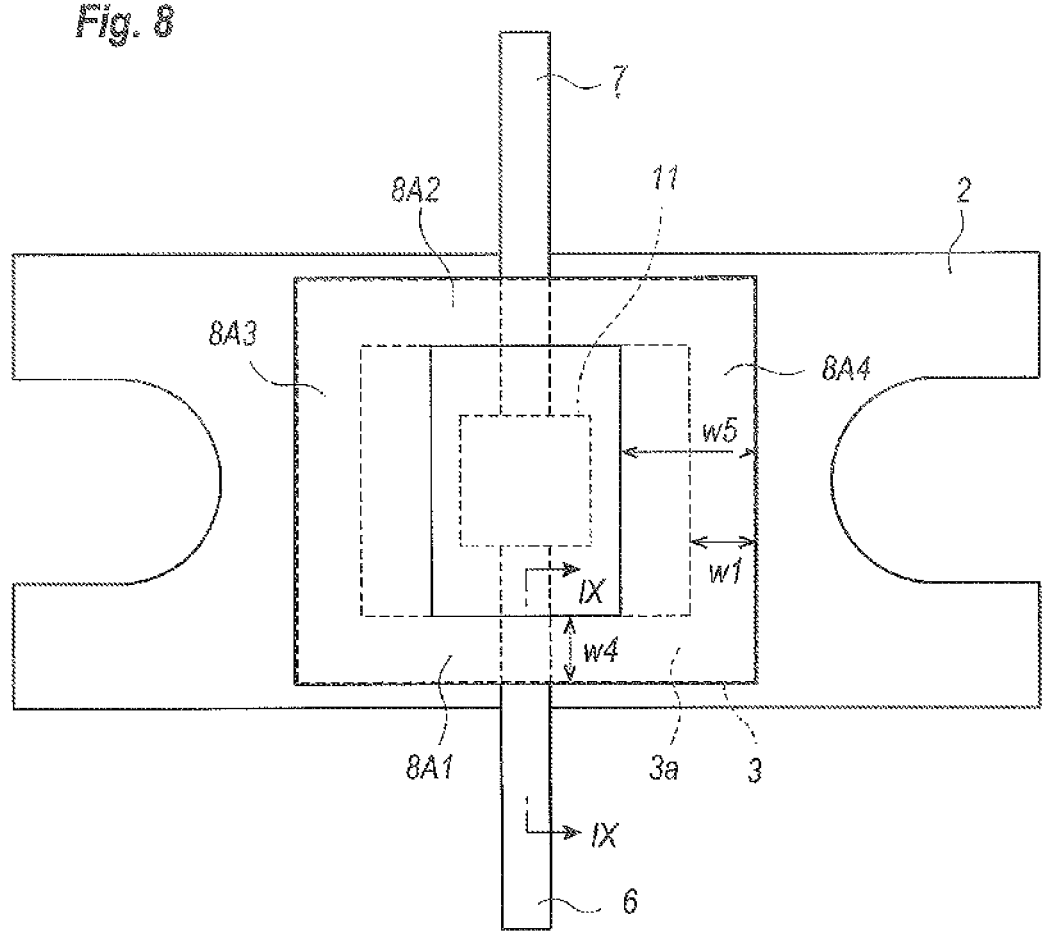
FIG. 8 is a plan view of the package according to the second embodiment shown in FIG. 7.

FIG. 8 is a plan view of the package according to the second embodiment shown in FIG. 7. As shown in FIG. 8, the sealing metal 8A covers the top surface 3a of the casing 3 but exposes the electronic device 11. Two regions, 8A1 and 8A2, described above are overlapped with the leads, 6 and 7. The width w4 of the regions, 8A1 and 8A2, at which the leads, 6 and 7, is overlapped therewith is narrower than or equal to the width w1 of the casing 3. On the other hand, the width w5 of the latter two regions, 8A3 and 8A4, which are not overlapped with the leads, 6 and 7, is wider than the width w1 of the casing 3.

Figure 9:
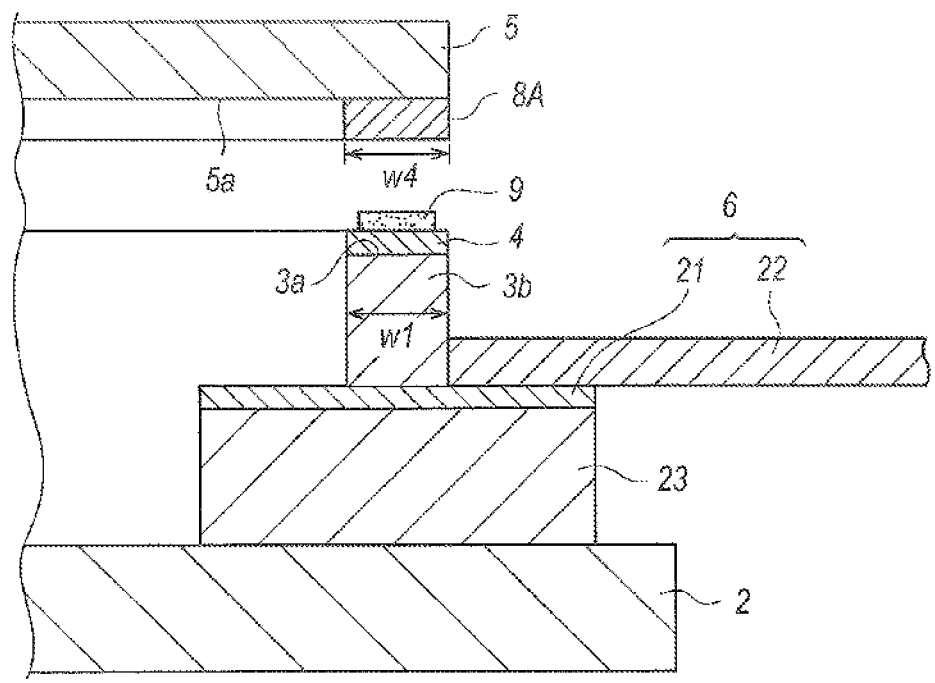
FIG. 9 magnifies a cross section taken along the line IX-IX denoting in FIG. 8.

FIG. 9 magnifies a cross section taken along the line IX-IX denoting in FIG. 8. As shown in FIG. 9, the lead 6 comprises a wiring pattern 21 and a terminal 22. The wiring pattern 21, which is provided on the feed-through 23 made of ceramics and forming a portion of the casing 3, passes through the side wall 3b of the casing 3. The wiring pattern 21 comprises the transmission line for high frequency signals by being put between the sealing metal 4 on the top surface 3a of the casing 3 and the base 2, both of which is grounded. The terminal 22 is fixed to the wiring pattern 21 outside of the side wall 3b. As described above, the width w4 of the sealing metal 8A provided in the lid 5 is narrower than or equal to the width w1 of the side wall 3b of the casing 3. The sealing metal 8A is overlapped with the lead 6 only at the side wall 3b of the casing 3.

Thus, the area of the sealing metal 8A of the lid 5 is wider than the area of the sealing metal 4 provided on the top surface 3a of the casing 3. The arrangement of the sealing metal 8A of the second embodiment shows a function same with that of the aforementioned embodiment. Moreover, the width w4 of the sealing metal 8A overlapped with the leads, 6 and 7, is narrower than or equal to the width w1 of the sealing metal 4 provided on the top surface 3a of the casing 3. Accordingly, the area facing the wiring pattern 21 of the lead 6 is unchanged before and after the setting the lid 5 on the casing 3, which means that, in addition to a function that the surplus brazing metal 9a spreads on the sealing metal 8A, the variation of the impedance attributed to the lead 6 may be substantially kept in constant.

Third Embodiment

Figure 11A:
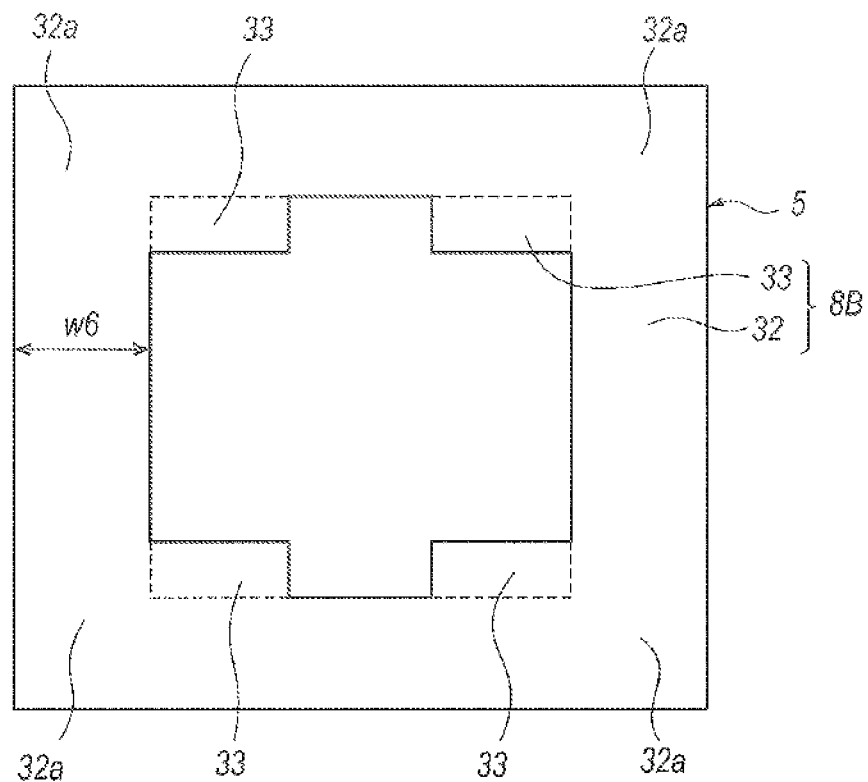
FIGS. 11A and 11B show the inner surface of the lid according to the third embodiment.
Figure 11B:
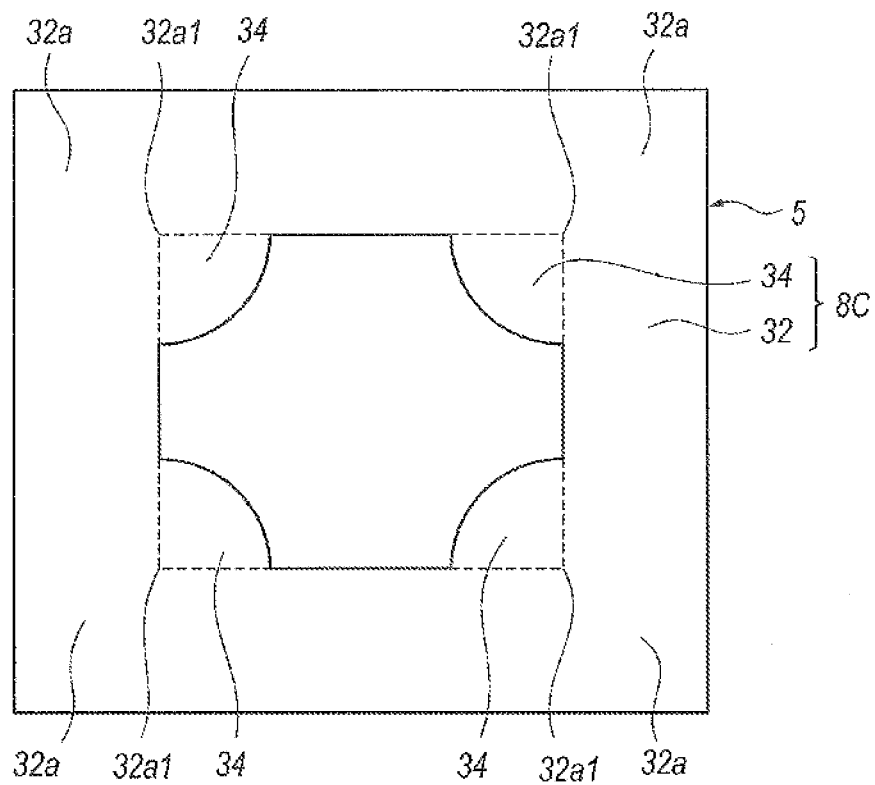

FIGS. 10A and 10B show the inner surfaces of the lids according to the second embodiment of the present application, and FIGS. 11A and 11B show the inner surface of the lid according to the third embodiment. In FIGS. 10A and 10B, areas, 31 and 31A denoted by two-dotted chain lines correspond to the area at which the electronic devices 11 and 11A on the base 2 is overlapped with the lid 5, respectively. When the electronic device 11A has a larger size, a portion of the sealing metal 8A is possibly overlapped with the electronic device 11A as shown FIG. 10B, which influences the high frequency performance of the electronic device 11A. Note that the electronic device 11A is described in FIG. 13.

The sealing metal 8B with a plane shape shown in FIGS. 11A and/or 11B may suppress the degradation of the high performance of the electronic device 11. That is, the sealing metal 8B shown in FIGS. 11A and 11B, provides a frame 32 and expanded areas 33, where the frame 32 faces the sealing metal 4 provided on the top surface 3a of the casing 3 and has a width w6 substantially equal to the width w1 of the side wall 3b. The expanded areas 33, which have rectangular shapes, expand inwardly from the frame 32 in respective four corners thereof. According to the sealing metal 8B shown in FIG. 11A, even width w6 of the frame 32 is equal to the width w1 of the side wall 3b, the area of the sealing metal 8B becomes larger than the area of the sealing metal 4 by, for instance, 120 to 130%.

The sealing metal 8B may have a plane shape of those shown in FIG. 11B to suppress the degradation in the high frequency performance of the electronic device 11A. That is, the expanded areas 34 each has a sector shape extending inwardly by respective corners 32a1 of the frame 32 as the center of the sector shape. Even in the sealing metal 8C shown in FIG. 11B, that is, even when the width w6 of the frame 32 is substantially equal to the width w1 of the side wall 3b of the casing 3, the area of the sealing metal 8C becomes wider than the sealing metal 4 provided on the top surface 3a of the casing 3 by, for instance 130 to 140%.

Figure 12:
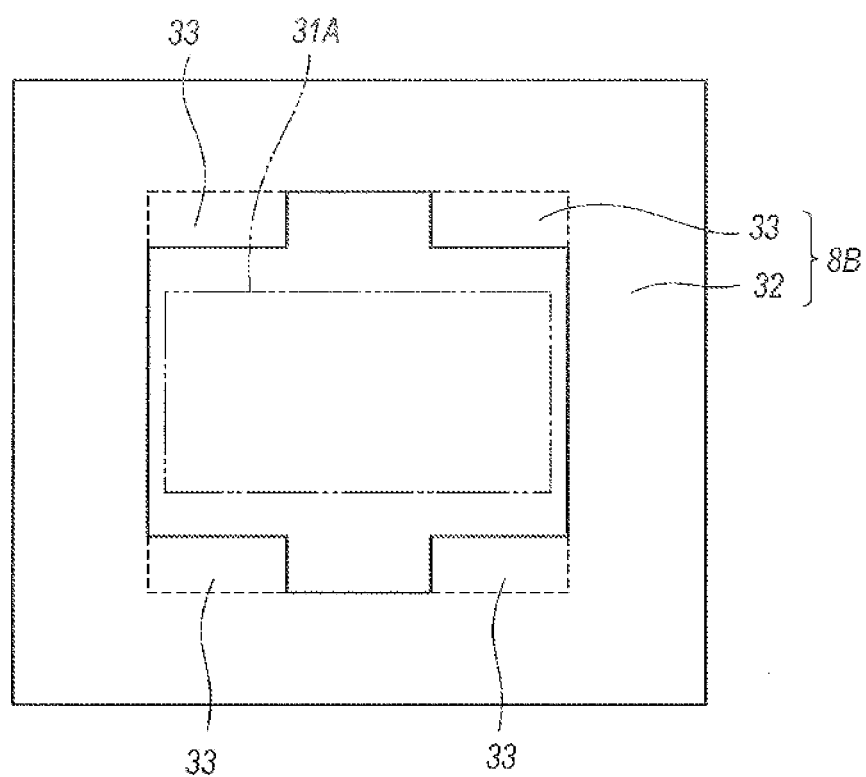
FIG. 12 indicates a central region in the inner surface of the lid shown in FIG. 11A.

FIG. 12 indicates the area 31A of the electronic device 11A by the two-dotted chain line against the sealing metal 8B shown in FIG. 11A. As shown in FIG. 12, the sealing metal 8B is not overlapped with the area 31A, that is, both the frame 32 and the extended areas 33 dodge the electronic device 11A.

Figure 13:
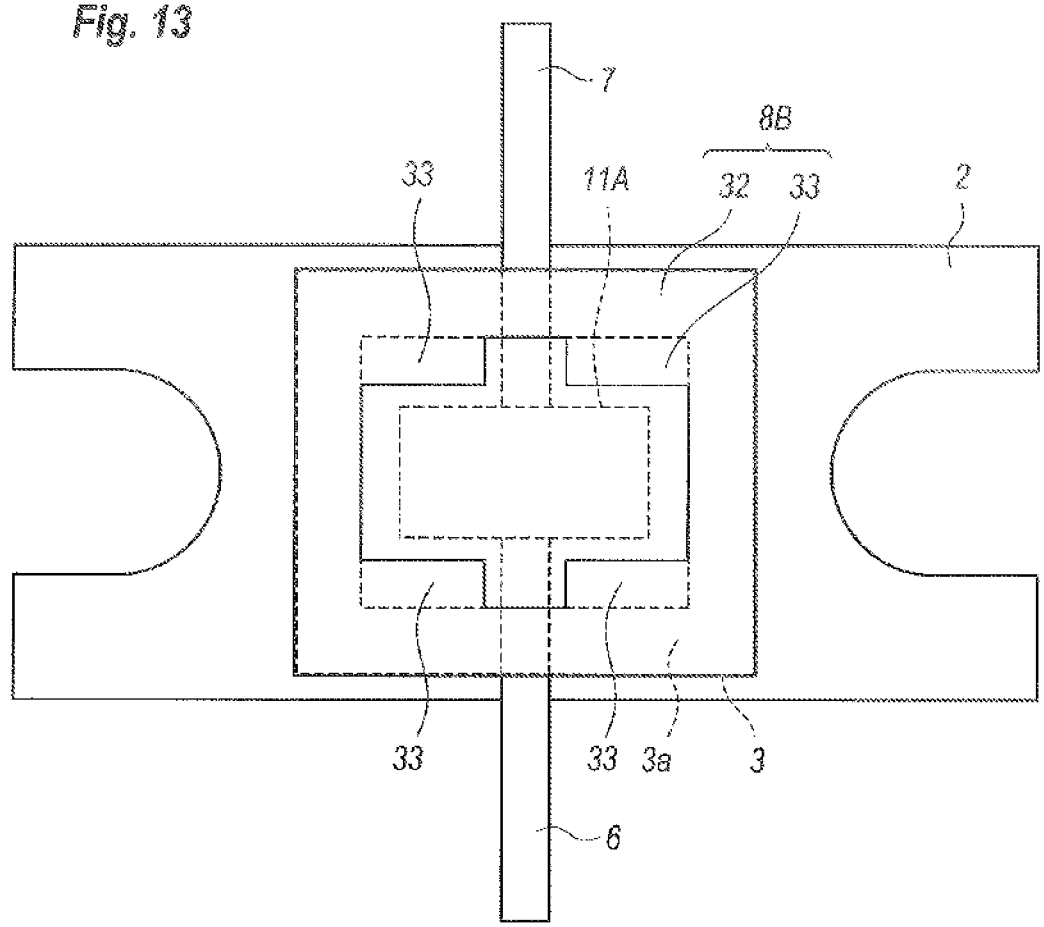
FIG. 13 is a plan view showing the inside of the package according to the third embodiment of the present invention.

FIG. 13 is a plan view showing the inside of the package according to the third embodiment of the present invention. The sealing metal 8B covers the top surface 3a of the casing 3 but exposes the electronic device 11A. Also, the extended areas 33 are not overlapped with the leads, 6 and 7. The leads, 6 and 7, are overlapped with the frame 32 but avoid the extended areas 33 positioned in both sides of respective leads, 6 and 7.

That is, respective leads, 6 and 7, are electrically connected to the electronic device 11A, but both sides of the respective leads, 6 and 7, within the casing 3 are free from the electronic device 11A. The arrangement where the sealing metal 8A whose extended areas 33 overlap with vacant areas of each side of respective leads, 6 and 7, may suppress the influence of the sealing metal 8A affected to the electronic device 11A. Moreover, the surplus brazing metal 9a may spread on the extended areas 33.

The area of the sealing metal 8B is greater than the area of the sealing metal 4 provided on the top surface 3a of the casing 3, specifically, the sealing metal 8B having the extended areas 33 is wider in the area thereof than that of the sealing metal 4. Accordingly, the sealing metal 8B shows the function same as those of the aforementioned embodiment. Because the sealing metal 8B in the extended areas 33 thereof are not overlapped with the electronic device 11A, the degradation of the high frequency performance of the electronic device 11A may be suppressed. The sealing metal 8C shown in FIG. 11B show the function same as those of the sealing metal 8B shown in FIG. 11A.

The package of the present invention thus described is not restricted to those of the first to Third embodiments. Various modifications are assumed. Accordingly, the appended claims are intended to encompass all such modifications and changes as fall within the true spirit and scope of this invention.

I claim:

1. A package for an electronic device, comprising:
   a metal base;
   a casing provided on the metal base, the casing being made of insulating material and having a top surface with a sealing metal thereon; and
   a lid made of insulating material, the lid having another sealing metal facing the sealing metal on the top surface of the casing and fixed thereto interposing with a brazing metal,
   wherein the another sealing metal on the lid has a frame shape with an area wider than an area of the sealing metal on the top surface of the casing;
   wherein the lid has a rectangular shape whose outer edges are substantially aligned with outer edges of the casing.

2. The package of claim 1,
   wherein the package further provides a lead electrically connected to the electronic device mounted on the metal base and in a space formed by the metal base and the casing, the lead passing through the casing, and
   wherein the another sealing metal has a portion overlapped with the lead, the portion having a width narrower than or equal to a width of the sealing metal facing the portion of the another sealing metal and fixed thereto.

3. The package of claim 1,
   wherein the another sealing metal provides a frame with a vacant area exposing an inner surface of the lid therein and an expanded area expanding from a corner of the frame inwardly to the vacant area.

4. The package of claim 3,
   wherein the expanded area is not overlapped with the electronic device installed within the space formed by the casing.

5. The package of claim 3,
   wherein the expanded area has a rectangular shape with a corner aligned with the corner of the frame.

6. The package of claim 3,
   wherein the expanded area has a sector shape a center aligned with the corner of the frame.

7. The package of claim 3,
   wherein the another sealing metal has outer edges aligned with outer edges of the lid.

8. The package of claim 3,
wherein the electronic device is mounted on a portion of the metal base overlapped with the vacant area of the another sealing metal.

9. The package of claim 1,
wherein the casing has side walls and the sealing metal has a width substantially equal to a wide of the side walls of the casing.

* * * * *